(12) United States Patent
Kondo

(10) Patent No.: US 6,271,669 B1
(45) Date of Patent: Aug. 7, 2001

(54) SENSOR CIRCUIT THAT CONVERTS DETECTED CHANGE VALUE FROM ANALOG TO DIGITAL VALUE

(75) Inventor: Takayuki Kondo, Osaka (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/372,977

(22) Filed: Aug. 12, 1999

(30) Foreign Application Priority Data

Feb. 2, 1999 (JP) .................................................. 11-025085

(51) Int. Cl.$^7$ .............................. G01R 35/00; H03M 1/34; H01H 47/00
(52) U.S. Cl. ........................ 324/601; 341/164; 341/163; 361/154; 73/204.14
(58) Field of Search ..................... 324/601; 73/204.14; 341/164, 143; 361/154

(56) References Cited

U.S. PATENT DOCUMENTS

| | | | |
|---|---|---|---|
| 3,603,147 | * 9/1971 | Dorman | 73/204.14 |
| 3,827,046 | * 7/1974 | Watson | 341/164 |
| 4,335,605 | * 6/1982 | Boyd | 73/204.14 |
| 4,416,153 | * 11/1983 | Williams | 73/295 |
| 4,530,024 | * 7/1974 | Brady, Jr. | 340/665 |
| 5,038,247 | * 8/1991 | Kelley et al. | 361/154 |
| 5,367,302 | * 11/1994 | Kalthoff et al. | 341/166 |
| 5,568,234 | * 10/1996 | Shiba | 399/59 |
| 5,700,090 | * 12/1997 | Eryurek | 374/210 |
| 5,956,663 | * 9/1999 | Eryurek | 702/182 |
| 6,011,257 | * 4/1997 | Endoh | 250/252.1 |

* cited by examiner

Primary Examiner—Glenn W. Brown
Assistant Examiner—Wasseem H. Hamdan
(74) Attorney, Agent, or Firm—Rabin & Champagne, P.C.

(57) ABSTRACT

A digital-to-analog converter 41, capable of setting a voltage V41 of an offset value using information JS. At the time of an offset correction operation, the voltage V41 of the offset signal is sequentially varied to automatically set it to a value that is extremely close to a lower executable conversion limit Vbottom within the convertible range of the analog-to-digital converter. With this structure it is possible to provide a sensor circuit that is capable of preventing lowered precision with temperature variations.

15 Claims, 5 Drawing Sheets

SENSOR CIRCUIT THAT CONVERTS DETECTED CHANGE VALUE FROM ANALOG TO DIGITAL VALUE

BACKGROUND OF THE INVENTION

1. Field of the Invention

The present invention relates to a sensor circuit for detecting a change in pressure or amount of light, which is detected by a pressure sensor, light sensor etc., as a change in resistance value, and outputting the change as a voltage change.

2. Description of the Related Art

Various sensors exist, such as pressure sensors and light sensors. A pressure sensor detects, for example, the weight of a turntable in a microwave oven and is used to convert this weight into an electrical signal. A light sensor is used to convert information that has been captured by an imaging device into an electrical signal.

Such a sensor circuit is known to comprise sensor elements for receiving pressure or light and representing the received pressure or light as a change in resistance value, and an amplifier circuit for producing a voltage value by amplifying the change in resistance value of the sensor elements as a voltage value. An output signal of the amplifier circuit, having the voltage value obtained from the amplifier circuit, is transmitted to an analog-to-digital converter. The analog-to-digital converter outputs the voltage value of the output signal from the amplifier circuit as digital data. In this manner, a pressure or amount of light is transmitted to peripheral circuits as digital data enabling various processing to take place.

Sensor circuits have various uses, such as those described above, and there are also various operating conditions for a device containing a sensor circuit. Particularly, the precision of a sensor circuit is influenced by the temperature of the environment in which it is used.

For example, there is a so-called drift characteristic where the resistance value of the sensor element varies depending on temperature. Generally, the range of variation in resistance value of the sensor elements widens with an increase in drift characteristic. In order to maintain the conversion range of an analog-to-digital converter with such a drift characteristic, it is necessary to reduce the amount of current flowing in the sensor elements or to limit the range of voltage output from the sensor by lowering sensitivity. As a result the drift characteristic hinders effective use of the resolution possessed by the analog-digital converter.

The effect of the drift characteristic will be described with reference to FIG. 9, which is a drawing showing the variation in the resistance value of a light sensor element with an increase in the amount of light, in the case of a sensor circuit for detecting variations in amount of light. In FIG. 9, the vertical axis represents sensor element resistance value and the horizontal axis represents light amount, with straight line A showing variations for a lower limit temperature and straight line A' showing variations for an upper temperature limit. Also, R0 is the resistance value when the light amount received by the sensor element at the lower temperature limit =0 (initial resistance value at lower temperature limit), and Rm is the resistance value when the light amount received by the sensor element at the lower temperature limit is a maximum. Similarly, R0' is the resistance value when the light amount received by the sensor element at the upper temperature limit =0 (initial resistance value at upper temperature limit), and Rm' is the resistance value when the light amount received by the sensor element at the upper temperature limit is a maximum. The range shown by X is preferable as a conversion range actually required by an analog-to-digital converter. However, since, due to the drift characteristic, a range can be from that of the straight line A to that of the straight line A' depending on the temperature, it is necessary for the conversion range of the analog converter to be the range shown by X'. This means that the conversion range of the analog-to-digital converter is increased and the sensitivity of the analog-to-digital converter per single bit is deteriorated.

SUMMARY OF THE INVENTION

An object of the present invention is to provide a sensor circuit that is capable of preventing lowering of precision in order to allow tolerance to temperature variation.

A further object of the present invention is to provide a sensor circuit capable of satisfying the above described object while significantly suppressing any increase in the circuit structure.

A still further object of the present invention is to provide a sensor circuit capable of satisfying the above described object while significantly suppressing any increase in processing.

In order to achieve the above described objects, the present invention provides a sensor circuit for transmitting an output signal of the voltage shift circuit to an analog-to-digital converter. The sensor circuit has a sensor element for varying a resistance value according to an amount of variation of an object of sensing, a circuit for converting variations in resistance value obtained from the sensor element into a voltage value, and a voltage shift circuit for shifting this voltage value. The sensor circuit of the present invention further comprises a digital-to-analog converter, for supplying an offset signal as one input of the voltage shift circuit, capable of selectively outputting an offset signal that has been set to one of a plurality of voltages for deriving the offset signal. The sensor circuit carries out offset correction for a resistance value of the sensor element with the object of sensing in a specified condition, by causing the voltage of the offset signal to be selectively varied.

The present invention is also preferably provided with a switch circuit capable of electrically connecting one terminal and another terminal of the voltage shift circuit, and is capable of setting the potential of the offset signal output from the digital-to-analog converter to a ground voltage.

Further, the present invention is preferably provided with a comparator for comparing the output signal of the analog-to-digital converter and the lower limit voltage that can be converted by the analog-to-digital converter, and outputting the result of comparison.

DETAILED DESCRIPTION OF THE PREFERRED EMBODIMENTS

Figure 1:
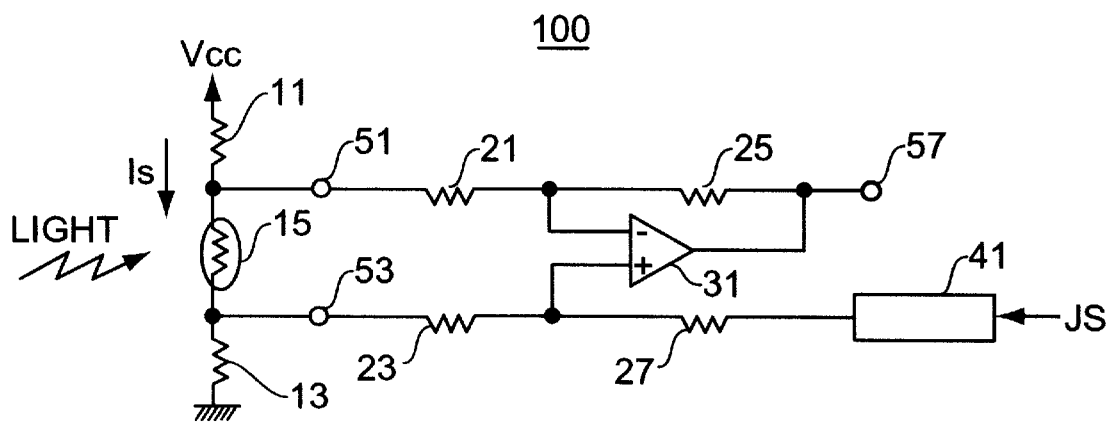
FIG. 1 is a circuit diagram of a sensor circuit 100 of a first embodiment of the present invention.

Embodiments of the present invention will now be described below using the attached drawings. FIG. 1 is a circuit diagram of a sensor circuit 100 of a first embodiment of the present invention. The embodiments will be described for a sensor that detects light amount received by a sensor element.

In FIG. 1, the sensor circuit 100 consists of resistive elements 11, 13, 21, 23, 25 and 27, a sensor element 15, an operational amplifier 31 operating as an amplifier circuit, and a digital-to-analog converter 41.

A power supply voltage Vcc is supplied to one terminal of the resistive element 11 and ground voltage Vss is supplied to one terminal of resistive element 13. The sensor circuit 15 is connected to the respective remaining terminals of the resistive elements 11 and 13. That is, the resistive element 11, the sensor element 15, and the resistive element 13 are sequentially connected in series between the power supply voltage Vcc and the ground voltage Vss.

If light of a desired amount is received, the sensor element 15 may in response, for example, vary a resistance value (lower the value, for example). If current flows in the resistive elements, voltages divided by the resistive element 11, the sensor element 15 and the resistive element 13 are developed at terminals 51 and 52. The voltages developed at the terminals 51 and 53 vary in response to variations in the resistance value of the sensor element 15.

If the voltage developed at terminal 51 is called V51 and the voltage developed at terminal 53 is called V53, a voltage V51–V53 constituting the output of the sensor element can be represented by the following equation (1). The resistance value of resistive element 11 is R11, the resistance value of the resistive element 13 is R13 and the resistance value of the sensor element 15 is R15, and the current flowing in the sensor element 15 is Is.

$$V51-V53 = R15 \times Is \quad (1)$$

In this way, variations in resistance value in response to received light can be seen as variations in voltage value at the terminals 51 and 53 using the resistive element 11, the sensor element 15 and the resistive element 13.

The resistive element 21 is connected between terminal 51 and the inverting input terminal of the operational amplifier 31. The resistive element 23 is connected between the terminal 53 and the non-inverting input terminal of the operational amplifier 31. The resistive element 25 is connected between the output terminal and the inverting input terminal of the operational amplifier 31. The resistive element 27 is connected between the non-inverting input terminal of the operational amplifier 31 and terminal 55. A signal output from the digital-to-analog converter 41 is transmitted to terminal 55. The output terminal of the operational amplifier 31 is also connected to terminal 57. A signal output from the terminal 57 constitutes an output signal of the sensor circuit 100. The output signal of the sensor circuit 100 is transmitted to an analog-to-digital converter at a subsequent stage. If the resistance value of the resistive element 21 is termed R21 and the resistance value of the resistive element 23 is termed R23, the following relationship is true: R21 and R23>>R15.

The digital-to-analog converter 41 has a resolution of, for example, 2 bits in the present embodiment. An offset signal, having a voltage V41 that can take one of 4 values corresponding to information (one of "00", "01", "10", or "11" (each of the numbers in quotes are binary numbers)) representing a 2-bit information signal JS input to the digital-to-analog converter 41 can be output. Offset correction is carried out using the voltage of the offset signal output from the digital-to-analog converter 41.

The operational amplifier 31 compares the voltage of the signal input to the non-inverting input terminal with the voltage input to the inverting input terminal, amplifies the result and outputs an output signal having a voltage Vout. The voltage Vout can be represented by the following equation.

$$Vout = V41 - (V51-V53) = V41 - R15 \times Is \quad (2)$$

The offset correction operation of the sensor circuit 100 having the above described structure will now be described with reference to FIG. 2, which is an explanatory drawing showing the offset correction operation. The offset correction operation can be, for example, a single software routine built into the sensor circuit 100, but it is preferably triggered by a one-shot pulse output from an auto-clear circuit or the like. In the latter case, it is possible to carry out offset correction processing in parallel with setting processing etc. for the peripheral circuits of the sensor circuit, which is more efficient and desirable from the point of view of increasing the speed of the device. In any case, in order to cancel the temperature dependency of the sensor circuit it is necessary to carry out the offset correction operation of the present invention at least immediately before measurement using the sensor circuit.

First of all, if the offset correction operation software is started, an information signal JS having information "11" is input to the digital-to-analog converter 41. The digital-to-analog converter 41 sets the highest voltage V11 as the voltage V41 of the offset signal of the digital-to-analog converter 41 in response to the information signal JS and outputs the offset signal.

In response to the voltage V11, voltage Vout1, derived from Vout represented by the equation (2) above, is compared with upper and lower conversion limit voltages Vtop and Vbottom, by the analog-to-digital converter arranged at a subsequent stage for receiving the output signal of the sensor circuit 100 having the voltage Vout1. The upper limit voltage and lower limit voltage are the upper limit value and lower limit value of conversion by the analog-to-digital converter and determined by the resolution of the analog-to-digital converter. This information can be previously stored in a register or the like. Conversion can be carried out by reading out information of the upper limit voltage and lower limit voltage stored in the register using the offset correction operation software.

Figure 2:
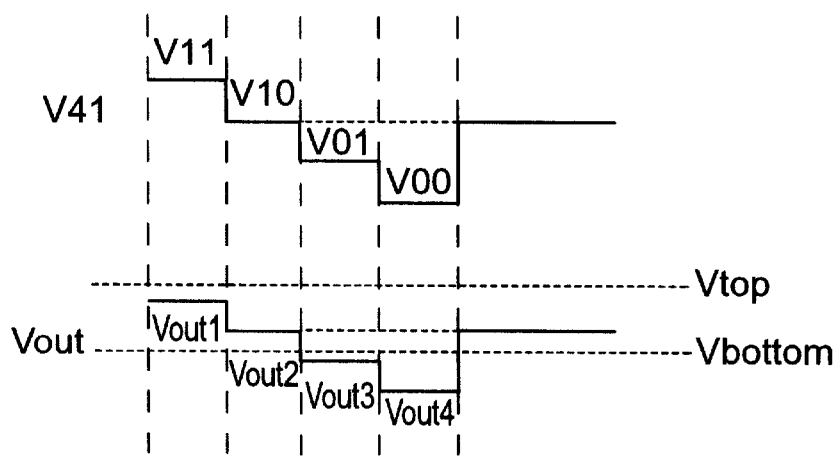
FIG. 2 is a drawing for describing an offset correction operation of the sensor circuit 100.

As shown in FIG. 2, since the result of comparison is Vtop>Vout1>Vbottom, it will be understood that conversion is possible by the analog-to-digital converter with offset voltage V41 corresponding to information "11". This decision result is stored in a register or the like.

Next, information signal JS having information "10" is input to the digital-to-analog converter 41. The digital-to-analog converter 41 sets the second highest voltage V10 as the voltage V41 of the offset signal of the digital-to-analog converter 41 in response to the information signal JS and outputs the offset signal.

In response to the voltage V10, the voltage of Vout2 represented by the equation (2) above, is compared with upper and lower conversion limit voltages Vtop and Vbottom, by the analog-to-digital converter arranged at a subsequent stage for receiving the output signal of the sensor circuit 100 having the voltage Vout2.

As shown in FIG. 2, since the result of comparison is Vtop>Vout2>Vbottom, it will be understood that conversion is possible by the analog-to-digital converter with offset voltage V41 corresponding to information "10". This decision result is stored by rewriting the contents of the register or the like.

Next, information signal JS having information "01" is input to the digital-to-analog converter 41. The digital-to-analog converter 41 sets the third highest voltage V01 as the voltage V41 of the offset signal of the digital-to-analog converter 41 in response to the information signal JS and outputs the offset signal.

In response to the voltage V01, the voltage of Vout3 represented by the equation (2) above, is compared with upper and lower conversion limit voltages Vtop and Vbottom, by the analog-to-digital converter arranged at a subsequent stage for receiving the output signal of the sensor circuit 100 having the voltage Vout3.

As shown in FIG. 2, since the result of comparison is Vtop>Vout3, but Vout3<Vbottom, it will be understood that conversion is not possible by the analog-to-digital converter with offset voltage V41 corresponding to information "01". This decision result is not stored in the register.

At the point in time where Vout becomes less than Vbottom, it becomes unnecessary to carry out the remaining comparison processing similar to that described above, but in this embodiment subsequent processing (comparison processing for information signal JS having information "00") is carried out based on verification of comparison processing. If the remaining comparison processing similar to that described above is not carried out for the information signal JS, there is the advantage that the time taken for the offset correction operation will be shortened.

As shown in FIG. 2, the result of comparison with output signal Vout4, corresponding to lowest voltage V00 as the voltage V41 of the offset signal of the digital-to-analog converter 41 based on information "00," is that Vout4<Vbottom, so it is understood that conversion is not possible by the analog-to-digital converter with offset voltage V41 corresponding to information "00". This decision result is not stored in the register.

As a result of the above described operation, it is selected that the second highest voltage corresponding to information "10"will be set as the voltage V41 of the offset signal. The offset signal of the sensor circuit 100 in a subsequent stage is set as this selected voltage V41 (information "10"). In this setting processing, a selected result (for example information "10") is stored in a register reset by a one shot pulse output from an auto clear circuit, or as a software variable of a control microcomputer, using the register for storing the decision result described above, and the output from the register storing the decision result is preferably input to the digital-to-analog converter 41.

In this way, an offset signal, having such a voltage that an output signal Vout of the sensor circuit 100 is taken in in an actually convertible range, is automatically selectable for a lower limit voltage of the actually convertible range in the analog-to-digital converter at a subsequent stage. As a result, even if a voltage dependent on the temperature is generated in the voltage V41 for offset correction, the voltage V41 of the offset signal can be automatically set so that it is extremely close to the lower limit of the actually convertible range, with the voltage Vout of the output signal of the sensor circuit 100 being within the actually convertible range of the analog-to-digital converter of the subsequent stage, by taking this into consideration. Accordingly, it is possible to reduce lowering of the precision of the sensor circuit 100 due to the output signal of the operational amplifier 31 being affected by temperature fluctuation.

Figure 10:
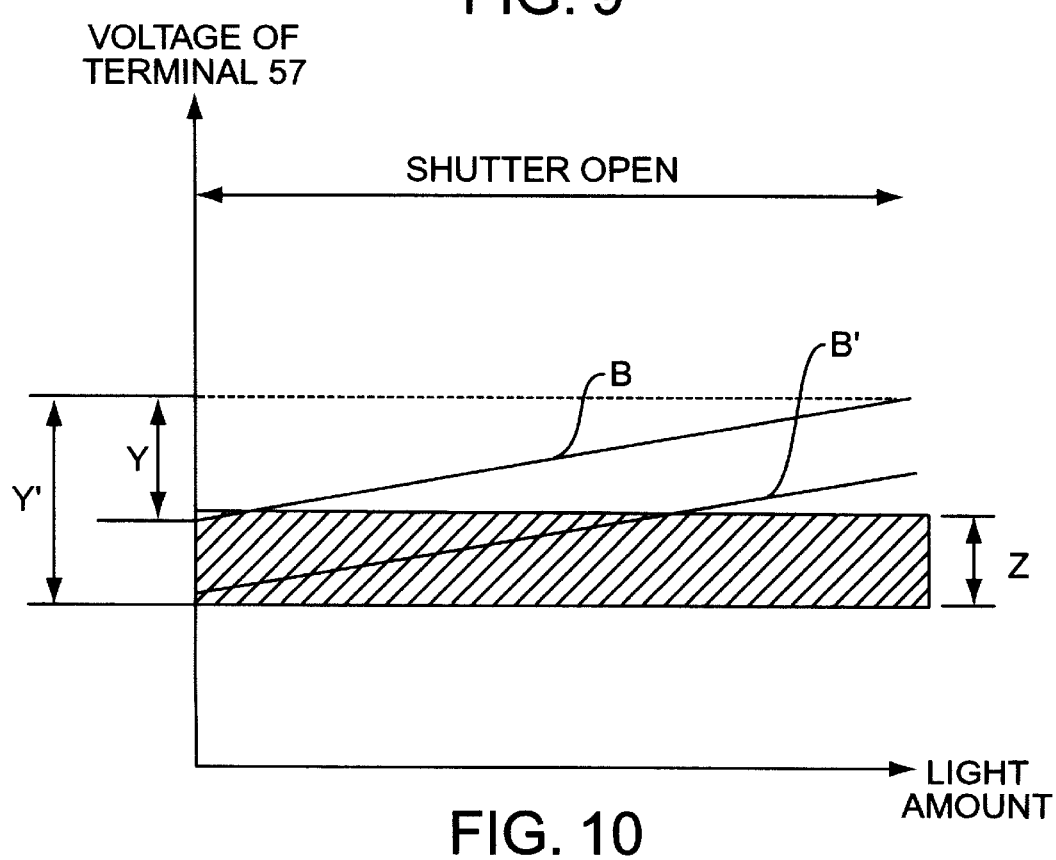
FIG. 10 is a drawing showing the relationship between input voltage to the analog-to-digital converter and light amount, for the first embodiment.

The effects of the first embodiment will be described using the attached drawings. FIG. 10 is a drawing showing the relationship between input voltage to the analog-to-digital converter and light amount, for the first embodiment. In FIG. 10, the vertical axis represents the voltage of terminal 57 constituting the input of the analog-to-digital converter while the horizontal axis represents light amount received by a sensor element. Variation in the voltage of terminal 57 for a light amount when temperature is at the lower limit is shown by straight line B, variation in the voltage of terminal 57 for a light amount when temperature is at the upper limit is shown by straight line B' and the hatched range Z is the conversion range of the analog-to-digital converter that has been widened by the resolution of the digital-to-analog converter. As shown in FIG. 10, the range shown as Y is a conversion range actually required for the analog-to-digital converter, but since it may be anywhere in the range from straight line B to straight line B' depending on temperature, because of the drift characteristic, the range shown by Y' becomes necessary as the conversion range of the analog-to-digital converter. However, as shown by the range Z, the conversion range of the analog-to-digital converter is actually widened by the resolution of the digital-to-analog converter, and the range Y' can be covered.

Also, as shown in FIG. 1, with respect to the circuit structure, the structure of the sensor circuit 100 is not particularly complicated.

The above described embodiment has been described for a digital-to-analog converter having a resolution of 2 bits, but it is also possible for the converter to have a resolution of 3 bits or more. By increasing the resolution of the digital-to-analog converter 41 it is possible to carry out offset correction with even higher precision.

Figure 3:
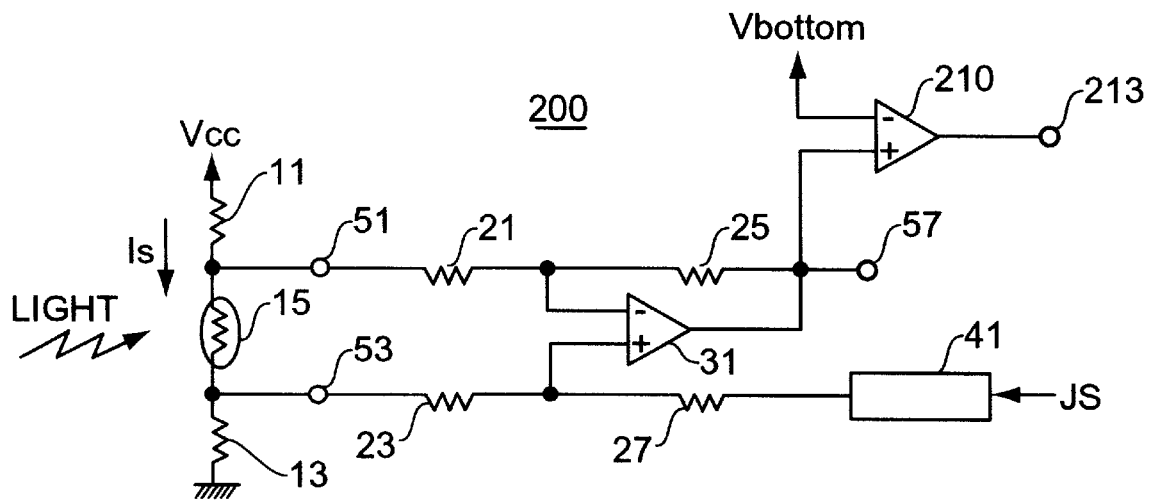
FIG. 3 is a circuit diagram of a sensor circuit 200 of a second embodiment of the present invention.

Next, a second embodiment will be described in the following using the attached drawings. FIG. 3 is a circuit diagram of a sensor circuit 200 of a second embodiment. Structural elements in FIG. 3 that are the same as these in FIG. 1 have the same reference numerals attached thereto, and description will be omitted.

In FIG. 3, compared to the sensor circuit 100, the comparator 210 is added as a comparison circuit. The remaining structure of the sensor circuit 200 is the same as that of the sensor circuit 100.

The comparator 210 has the non-inverting input terminal connected to terminal 57, and a voltage equivalent to a lower conversion limit voltage Vbottom of an analog-to-digital converter arranged at a subsequent stage is supplied to the inverting input terminal. The output terminal of the comparator 210 is connected to terminal 213.

The comparator 210 compares the voltage Vout of the output signal of the sensor circuit 200 that is input to the non-inverting input terminal with the lower conversion limit voltage Vbottom of the analog-to-digital converter that is input to the inverting input terminal, and outputs the result of comparison. For example, in the case of the normal condition where Vout>Vbottom, a H level signal (power supply voltage Vcc level) is output, while in the abnormal condition where Vout<Vbottom, an L level signal (ground voltage Vss level) is output. The signal output from the comparator 210 is transmitted to terminal 213, so by monitoring the voltage level of terminal 213 it is possible to be immediately aware of abnormality (for example, the occurrence of a signal of a voltage deviating from the convertible range of the analog-to-digital converter) of the output signal Vout from the sensor circuit 200.

If detection of an abnormal condition of the offset correction operation described in the first embodiment is carried out in response to the comparison result of the comparator 210, it is possible to confirm the condition of the voltage Vout faster and more easily. Also, if the software for the offset correction operation is started in response to detection of the abnormal condition by the comparator 210, then even if the temperature of the environment in which the sensor circuit 200 is installed changes it becomes possible to carry out suitable offset correction that keeps step with the temperature variation. In this case, a register or the like for storing the result at the time of executing the offset correction operation software must be capable of being reset in response to the occurrence of a voltage signal indicating that the comparator 210 has an abnormality.

The above described comparator 210 can be configured so as to handle the case of Vout=Vbottom as an abnormal state or as a normal state. In the former case, that is, handling Vout=Vbottom as an abnormal state, it is possible to carry out processing for abnormality earlier. In the latter case, it is possible to increase the normal state range which means that it is possible to reduce the number of times the offset correction operation is carried out.

Figure 4:
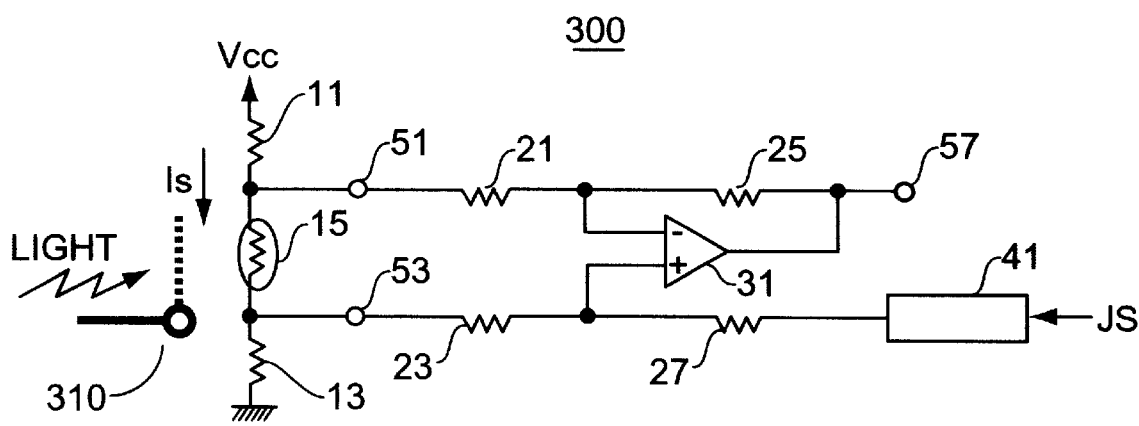
FIG. 4 is a circuit diagram of a sensor circuit 300 of a third embodiment of the present invention.

Next, a third embodiment will be described using the attached drawings. FIG. 4 is a circuit diagram of a sensor circuit 300 of the third embodiment. Structural elements in FIG. 4 that are the same as those in FIG. 1 have the same reference numerals attached thereto, and description will be omitted.

As shown in FIG. 4, compared to the sensor circuit 100, the sensor circuit 300 also comprises a shutter mechanism 310 for interrupting light entering into the sensor element 15. The remaining structure of the sensor circuit 300 is the same as that of the sensor circuit 100.

The opening and closing operation of the shutter mechanism 310 is capable of being controlled by software for the offset correction operation described above. When used as an ordinary sensor, the shutter mechanism 310 is in an open state and the sensor element 15 is capable of receiving light.

Figure 5:
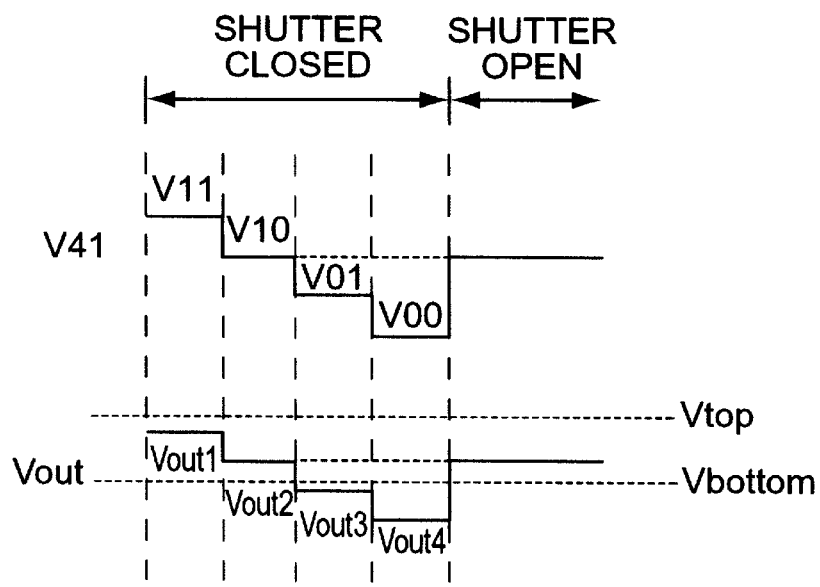
FIG. 5 is a drawing for describing an offset correction operation of the sensor circuit 300.

The offset correction operation of the sensor circuit 300 having the above described structure will now be described with reference to the drawings. FIG. 5 is an explanatory drawing showing the offset correction operation. The offset correction operation is the same as that in the first embodiment, for example, and is activated immediately before the device in which the sensor circuit 300 is installed commences measurement.

First of all, the shutter mechanism 310 is put into a closed state. That is, the sensor element 15 is prevented from receiving light and the resistance value of the sensor element 15 is set as an initial value.

In this state, similarly to the first embodiment, information of an information signal JS made to change sequentially from "11" towards "00", an offset signal having a voltage V41 based on respective information of the information signal is input to the operational amplifier 31, and an output signal Vout from the operational amplifier 31 based on this offset signal is compared with a lower limit voltage Vbottom of the analog-to-digital converter.

In FIG. 5, first of all the information of the information signal JS is set to "11" and the digital-to-analog converter 41 sets and outputs the highest voltage V11 as voltage V41 of the offset signal of the digital for the analog converter 41 in response to this information.

A Vout voltage of Vout1, corresponding to the voltage V11 and represented by the above equation (2), is compared with the lower limit voltage Vbottom that can be converted by analog-to-digital converter arranged at a later stage for receiving an output signal of the sensor circuit 300 having this voltage Vout1.

As shown in FIG. 5, since the result of this comparison is that Vout1>Vbottom, it is understood that the analog-to-digital converter is capable of conversion with the offset voltage V11 corresponding to the information "11". This decision result is stored in a register or the like.

Next, the information of information signal JS is set to "10" and the digital-to-analog converter 41 sets and outputs the second highest voltage V10 as voltage V41 of the offset signal of the digital for the analog converter 41 in response to this information.

A Vout voltage of Vout2 corresponding to the voltage V10 and represented by the above equation (2) is compared with the lower limit voltage Vbottom that can be converted by an analog-to-digital converter arranged at a later stage for receiving an output signal of the sensor circuit 300 having this voltage Vout2.

As shown in FIG. 5, the result of this comparison is that Vout2<Vbottom and it is understood that the analog-to-digital converter is not capable of conversion with the offset voltage V10 corresponding to the information "10". This decision result is not stored in the register.

After that, similarly to the first embodiment, as shown in FIG. 5, Vout voltages of Vout3 and Vout 4 as offset voltages V41 respectively corresponding to information signals for information "01" and "00" and represented by the above equation (2) are compared with the lower limit voltage Vbottom that can be converted by an analog-to-digital converter arranged at a later stage for receiving an output signal of the sensor circuit 300 having the voltage Vout3 or the voltage Vout 4. The results of both of these two comparisons are that Vout3<Vbottom and Vout4<Vbottom. These decision results are not stored in the register.

After that, an offset signal V41 of the digital-to-analog converter is set to offset voltage V11 (=V41) corresponding to the information signal for information "11", which is the convertible range of the analog-to-digital converter. The shutter mechanism 310 is then closed, with the result that a resistance value of the sensor element 15 varies in response to a light amount input via the shutter mechanism 310.

As a result, the voltage of the output signal Vout of the operational amplifier 3, being the output signal of the sensor circuit 300, is determined according to the resistance value obtained by adding an extent of change due to light amount to the initial resistance value of the sensor circuit 300. Thus, a remainder after subtracting Vout1 for the offset voltage V41 (=V11) corresponding to the information signal for information "11" at the time the shutter mechanism is closed from the output signal Vout of the operational amplifier 31 when light is received can be detected as an extent of change in voltage corresponding to a true light amount.

In this way, since the output signal Vout corresponding to the initial resistance value of the sensor element 15 can be detected and set with the shutter mechanism closed, then even if there are variations in the initial resistance value of the sensor element 15 due to temperature variations, because of the drift characteristic, it is possible to carry out optimal offset correction following these variations. This means that executable range of conversion of the analog-to-digital converter can be extended.

Also, by carrying out a calculation of subtracting a result of analog to digitally converting an output signal Vout corresponding to an initial resistance value of the sensor element 15 with the shutter mechanism closed from a result of analog to digitally converting an output signal Vout obtained when the shutter mechanism is open, it is possible to detect voltage variations corresponding to true light amount. This means that if this type of processing is carried out, then even if the output signal is affected by temperature variations in the environment in which the sensor is used, it becomes possible to remove the effects of these temperature variations.

Figure 6:
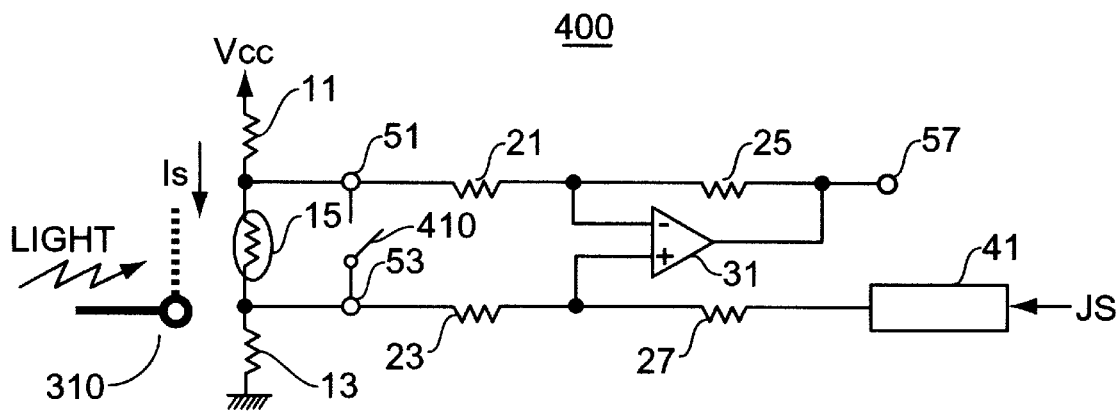
FIG. 6 is a circuit diagram of a sensor circuit 400 of a fourth embodiment of the present invention.

Next, a fourth embodiment will be described with reference to the attached drawings. FIG. 6 is a circuit diagram of a sensor circuit 400 of the fourth embodiment. In FIG. 6, structural elements that are the same as those in FIG. 4 have the same reference numerals attached thereto, and repeated description thereof will be omitted.

The sensor circuit 400 of FIG. 6 also has a switch circuit 410 compared to the sensor circuit 300. The remaining structure of the sensor circuit 400 is the same as that of the sensor circuit 300.

The switch circuit 410 is electrically connected between the terminal 51 and the terminal 53. The switch circuit 410 can have any structure, but if a MOS transistor structure is used it is possible to use the same MOS technology as in the other essential elements of the sensor circuit 400 without the need to increase the surface area, which is efficient as there no need to increase the manufacturing steps. The switch circuit 410 is put in a conductive state, for example, at an initial stage of executing the offset correction operation software, and is controlled by the software.

Figure 7:
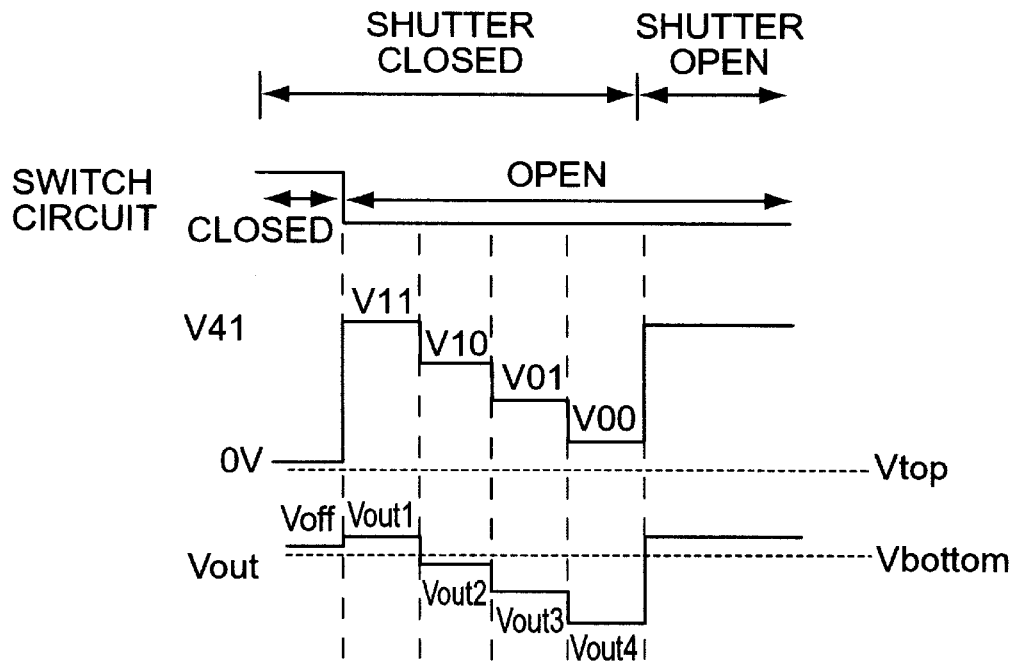
FIG. 7 is a drawing for describing an offset correction operation of the sensor circuit 400.

The offset correction operation of the sensor circuit 400 having the above described structure will now be described with reference to the drawings. FIG. 7 is an explanatory drawing showing the offset correction operation. Similarly to the third embodiment, for example, the offset correction operation is executed by initializing software when power to the device in which the sensor circuit 400 is installed is switched on.

First of all, as shown in FIG. 7, in the offset correction operation the shutter mechanism 310 is closed and the switch circuit 410 is put in a conducting state. 0V is set and output as the voltage V41 of the offset signal of the digital-to-analog converter 41. Setting the voltage V41 of the offset signal of the digital-to-analog converter 41 to 0V can be done using a one shot pulse generated, for example, by a circuit capable of generating a one shot pulse immediately before measurement, such as an auto clear circuit, to put the voltage V41 of the offset signal of the digital to analog converter 41 in a reset state and outputting 0V.

As a result, as shown by equation (2), voltage V51 becomes equal to voltage V53 so that the voltage Vout of the output signal of the operational amplifier 31 becomes equal to Voff. This voltage Voff is equivalent to an input offset voltage generated in the operational amplifier 31 as a result of temperature variations. This Voff is stored using a register or the like.

Following that, similarly to the third embodiment, respective voltages Vout are obtained by sequentially changing information of the information signal JS from "11" in the direction of "00", with the shutter mechanism 310 remaining closed, and these voltages Vout are compared with the lower limit voltage Vbottom of the convertible range of the analog-to-digital converter.

As shown in FIG. 7, in this embodiment, when the voltage V41 of the offset signal of the digital-to-analog converter 41 is set to the second highest voltage when the information of the information signal JS is "10", the voltage Vout2 of the output signal in this case becomes less than Vbottom, and it is understood that the analog-to-digital converter is incapable of conversion with the offset voltage V41 corresponding to information "10". This decision result, namely the fact that information for the case where the analog-to-digital converter is capable of conversion is "11", is stored in a register or the like.

After that, similarly to the third embodiment, the offset signal of the analog-to-digital converter is set to offset voltage V1 corresponding to an information signal for information "11", being in the convertible range of the analog-to-digital converter, and the shutter mechanism 310 is opened. As a result, the resistance value of the sensor element 15 varies in response to a light amount input through the shutter mechanism 310.

Accordingly, the voltage of the output signal Vout of the operational amplifier 31, being the output signal of the sensor circuit 400, corresponds to a resistance value obtained by adding an extent of change due to the light amount to an initial resistance value of the sensor element 15. This means that a remainder after subtracting Vout1 for the offset voltage V41 corresponding to an information signal for information "11" when the shutter mechanism 310 is closed and the above mentioned input offset voltage Voff from the output signal Vout of the operational amplifier 31 at that time can be detected as a changed portion of the voltage corresponding to the true light amount.

In this way, since it is possible to previously detect the input offset voltage Voff of the operational amplifier 31 with the switch circuit in a conductive state, in addition to the effects of the third embodiment it is also possible to detect variations in voltage corresponding to a true light amount with an input offset voltage portion removed, by carrying out a calculation to subtract voltage Voff and a result of analog-to-digitally converting an output signal Vout corresponding to an initial resistance value of the sensor element 15 with the shutter closed from a result of analog to digitally converting output signal Vout obtained when the shutter mechanism is open. Accordingly, if this type of processing is carried out, even if the output signal Vout is affected by variations in the temperature of the environment where the sensor circuit is used, it is possible to more reliably remove the effects of these temperature variations.

Figure 8:
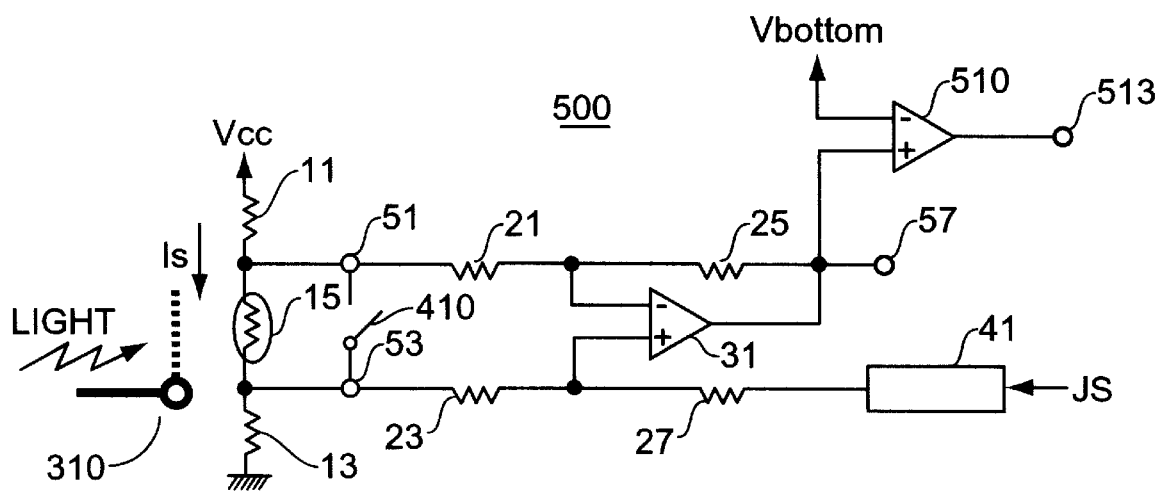
FIG. 8 is a circuit diagram of a sensor circuit 500 of a fifth embodiment of the present invention.
Figure 9:
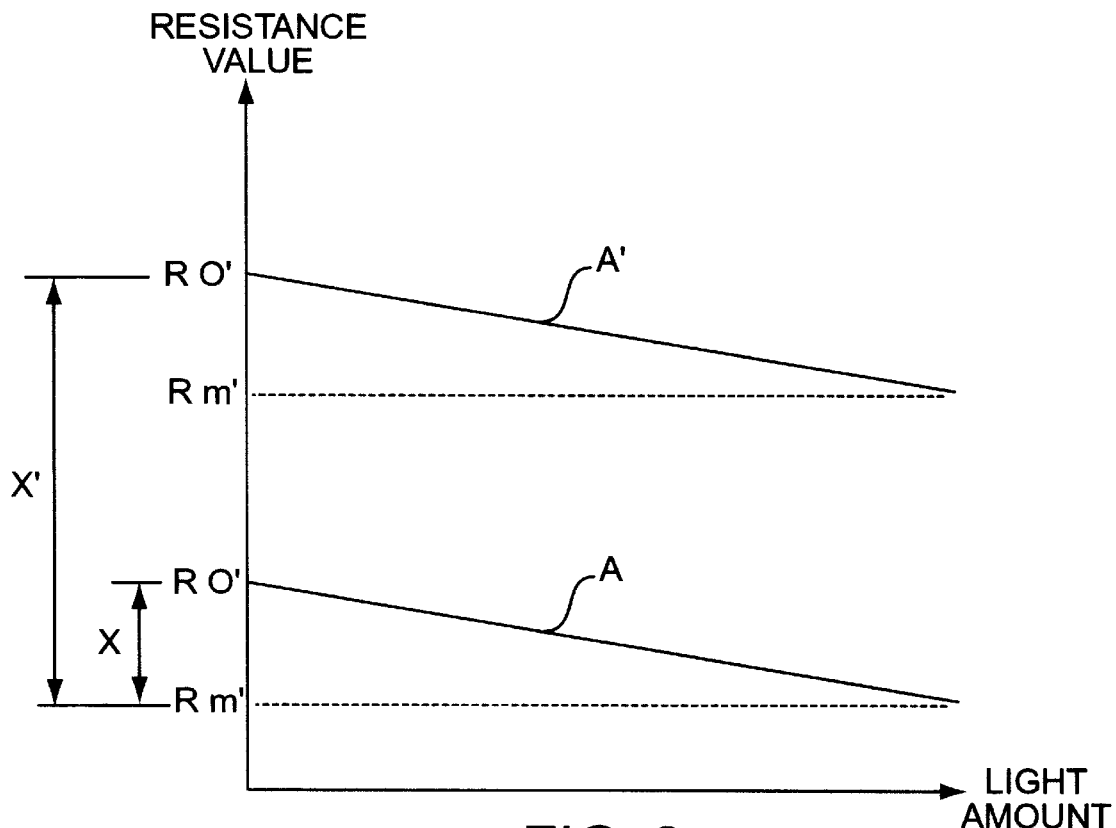
FIG. 9 is a drawing showing light amount and variations in resistance value of the sense element for that light amount, in the case of a sensor circuit for detecting variations in light amount.

A fifth embodiment will now be described with reference to the attached drawings. FIG. 8 is a circuit diagram of a sensor circuit 500 of the fifth embodiment. In FIG. 8, structural elements that are the same as those in FIG. 6 have the same reference numerals attached thereto, and description thereof will be omitted.

Compared to the sensor circuit 400, the sensor circuit 500 of FIG. 8 also has a comparator 510 as a comparison circuit. The remaining structure of the sensor circuit 500 is the same as that of the sensor circuit 400.

The comparator 510 has the same function as the comparator 210 of FIG. 3. That is, the comparator 510 has a non-inverting input terminal connected to terminal 57, and a voltage equivalent to the lower conversion limit voltage Vbottom of the analog-to-digital converter arranged at a subsequent stage is supplied to the inverting input terminal. The output terminal of the comparator 510 is connected to terminal 513.

The comparator 510 has a similar operation to that of the comparator 210 of the second embodiment. If detection of an abnormal state of the offset correction operation described in the fourth embodiment is carried out by inspecting the voltage of the terminal 513 in response to a detection result of the comparator 510, it is possible to confirm the condition of the voltage Vout more easily and at high speed. Also, if software for the offset correction operation is initiated in response to detection of an abnormal condition by the comparator 510, then even if there are variations in the temperature of the environment in which the device in which the sensor circuit 500 is installed, it becomes possible to carry out optimal offset correction that follows these variations in temperature. In this case, a register or the like for storing a result of offset correction operation software execution must be capable of being reset in response to a voltage signal representing an abnormality generated by the comparator 510.

Although each of the embodiments of the present invention have been described in detail above, the present invention is not limited to the structure of these embodiments.

For example, in the fifth embodiment shown in FIG. 8, if the input offset voltage Voff of the operational amplifier 31 is not a significant problem it is possible to remove the switch circuit 410 in FIG. 8.

Also, each of the embodiments has been described as a sensor circuit for detecting light amount, it goes without saying that the present invention can also be applied to a pressure sensor, humidity sensor, load sensor etc. whose characteristics change due to external causes such as temperature, pressure etc.

Particularly, the embodiments provided with the shutter mechanism 310 can be adapted to a sensor circuit capable of measuring an initial resistance value of a sensor element 15 for light amount, load etc.

Also, the resistive elements 11, 13, 21, 23, 25 and 27 can be constructed as MOS resistors being MOS transistors having a desired voltage supplied to a gate electrode so that they are in a normally conductive state.

What is claimed is:

1. A sensing circuit having an offset voltage adjusting function, the sensing circuit outputting a sensing signal to an analog-to-digital (A/D) converter, the sensing circuit comprising:

a sensing element having a resistance value, the resistance value variably changing in response to an amount of change in a sensing object, the object able to be shut off from the sensing element by a shutting mechanism;

an amplifying circuit having first and second input nodes that respectively receive a first voltage and a second voltage, wherein said amplifying circuit compares the first voltage with the second voltage and outputs an analog signal amplified in accordance with the comparison result, the first voltage being generated based on the resistance value of said sensing element;

a switching circuit that opens and closes an electrical connection of said first input node to said second input node;

a voltage generating circuit that generates the second voltage in accordance with an offset information signal that includes a plurality of bits, said voltage generating circuit including a digital-to-analog (D/A) converter that converts the offset information signal into the second voltage;

an output node coupled to said A/D converter, said output node supplied with said sensing signal in accordance with the first voltage and the analog signal output by said amplifying circuit; and a comparing circuit that receives and compares said sensing signal and a set monitoring voltage, and outputs a comparison signal.

2. The sensing circuit according to claim 1, further comprising a comparing circuit that receives and compares said sensing signal and a set monitoring voltage, and outputs a comparison signal.

3. The sensing circuit according to claim 2, further comprising a switching circuit that electrically connects said first input node to said second input node.

4. The sensing circuit according to claim 3, wherein said sensing circuit includes a shutting mechanism that shuts off said sensing object from said sensing element.

5. The sensing circuit according to claim 2, further comprising:

means for determining the offset information signal; and a storing circuit that stores the offset information signal.

6. The sensing circuit according to claim 1, further comprising a switching circuit that electrically connects said first input node to said second input node.

7. The sensing circuit according to claim 2, wherein said sensing circuit includes a shutting mechanism that shuts off said sensing object from said sensing element.

8. The sensing circuit according to claim 6, further comprising:

means for determining the offset information signal; and a storing circuit that stores the offset information signal.

9. The sensing circuit according to claim 1, further comprising a shutting mechanism that shuts off said sensing object from said sensing element.

10. The sensing circuit according to claim 9, further comprising:

means for determining the offset information signal; and a storing circuit that stores the offset information signal.

11. The sensing circuit according to claim 1, further comprising:

means for determining the offset information signal; and a storing circuit that stores the offset information signal.

12. The sensing circuit according to claim 11, wherein the offset signal is determined by a pulse signal.

13. The sensing circuit according to claim 12, wherein said storing circuit resets according to the pulse signal.

14. The sensing circuit according to claim 11, wherein said offset adjusting means is responsive to controlling software stored therein.

15. A sensing circuit having an offset voltage adjusting function, the sensing circuit outputting a sensing signal to an analog-to-digital (A/D) converter, the sensing circuit comprising:

a sensing element having a resistance value, the resistance value variably changing in response to an amount of chance in a sensing object, a shutting mechanism that shuts off the object able to be from the sensing element;

an amplifying circuit having first and second input nodes that respectively receive a first voltage and a second voltage, wherein said amplifying circuit compares the first voltage with the second voltage and outputs an analog signal amplified in accordance with the comparison result, the first voltage being generated based on the resistance value of said sensing element;

a switching circuit that opens and closes an electrical connection of said first input node to said second input node;

a voltage generating circuit that generates the second voltage in accordance with an offset information signal that includes a plurality of bits, said voltage generating circuit including a digital-to-analog (D/A) converter that converts the offset information signal into the second voltage;

an output node coupled to said A/D converter, said output node supplied with said sensing signal in accordance with the first voltage and the analog signal output by said amplifying circuit, and a comparing circuit that receives and compares said sensing signal and a set monitoring voltage, and outputs a comparison signal.

* * * * *